United States Patent
Lee et al.

(10) Patent No.: US 8,847,634 B1
(45) Date of Patent: Sep. 30, 2014

(54) HIGH-SPEED UNITY-GAIN INPUT BUFFER HAVING IMPROVED LINEARITY AND STABILITY WITH A LOW SUPPLY VOLTAGE

(71) Applicant: Texas Instruments Incorporated, Dallas, TX (US)

(72) Inventors: Bumha Lee, Pleasanton, CA (US); Satoshi Sakurai, San Carlos, CA (US); Sing W. Chin, Alameda, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/887,290

(22) Filed: May 4, 2013

(51) Int. Cl.
*H03K 3/00* (2006.01)
*H03K 17/00* (2006.01)

(52) U.S. Cl.
CPC ........................................ *H03K 17/00* (2013.01)
USPC .......................................................... 327/108

(58) Field of Classification Search
None
See application file for complete search history.

(56) References Cited

U.S. PATENT DOCUMENTS

| | | | | |
|---|---|---|---|---|
| 4,622,480 | A * | 11/1986 | Uchimura et al. | 327/337 |
| 6,876,235 | B2 * | 4/2005 | Li et al. | 327/112 |
| 7,221,194 | B2 * | 5/2007 | Lin et al. | 327/108 |
| 7,378,883 | B1 * | 5/2008 | Hsueh | 327/108 |
| 7,417,484 | B1 * | 8/2008 | Voo | 327/333 |
| 7,443,202 | B2 * | 10/2008 | Kimura et al. | 326/82 |
| 7,663,404 | B2 * | 2/2010 | Kimura et al. | 326/82 |
| 7,804,328 | B2 * | 9/2010 | Pentakota et al. | 326/82 |
| 8,040,297 | B2 * | 10/2011 | Chung | 345/76 |
| 8,085,078 | B2 * | 12/2011 | Honda | 327/333 |
| 8,174,291 | B1 * | 5/2012 | Shah et al. | 327/65 |
| 2007/0091029 | A1 * | 4/2007 | Uchino et al. | 345/76 |
| 2008/0101450 | A1 * | 5/2008 | Wu et al. | 375/232 |
| 2010/0090721 | A1 * | 4/2010 | Byeon | 326/83 |
| 2011/0215837 | A1 * | 9/2011 | Li et al. | 326/95 |
| 2013/0082760 | A1 * | 4/2013 | Umezaki | 327/404 |
| 2013/0314139 | A1 * | 11/2013 | Umezaki | 327/208 |

OTHER PUBLICATIONS

Hernes, Bjomar et al., "A 1.2V 220MS/s 10b Pipeline ADC Implemented in 0.13μm Digital CMOS", 2004 IEEE International Solid-State Circuits Conference Digest of Technical Papers (ISSCC), 2004, 14.3, pp. 256-526 vol. 1.

Ali, Ahmed M. A. et al., "A 16b 250MS/s IF-Sampling Pipelined A/D Converter with Background Calibration", 2010 IEEE International Solid-State Circuits Conference Digest of Technical Papers (ISSCC), 2010, pp. 292-293.

* cited by examiner

*Primary Examiner* — Lincoln Donovan
*Assistant Examiner* — Khareem E Almo
(74) *Attorney, Agent, or Firm* — Alan A. R. Cooper; Frederick J. Telecky, Jr.

(57) ABSTRACT

A high-speed unity-gain input buffer steers the current that flows down a first path to an output node, and down a second path in response to an analog input signal. The current that flows down the second path is mirrored to sink a current out of the output node.

16 Claims, 3 Drawing Sheets

HIGH-SPEED UNITY-GAIN INPUT BUFFER HAVING IMPROVED LINEARITY AND STABILITY WITH A LOW SUPPLY VOLTAGE

BACKGROUND OF THE INVENTION

1. Field of the Invention

The present invention relates to unity-gain input buffers and, more particularly, to a high-speed unity-gain input buffer having improved linearity and stability with a low supply voltage.

2. Description of the Related Art

An analog-to-digital converter (ADC) is an electronic circuit that converts an analog input signal into a corresponding digital code that represents the magnitude of the analog input signal. ADCs commonly include a switched capacitor circuit that includes a first switch connected to an analog input signal, a capacitor with a first plate that is connected to the first switch, and one side of a second switch that is connected to a second plate of the capacitor. In addition, a common mode input node, which has a common mode voltage level, is connected to the other side of the second switch.

It is also common for ADCs to include an integrated unity-gain input buffer that is connected to, and lies between, an analog input pin and the first switch, where the first switch lies between the input buffer and the capacitor. An integrated unity-gain input buffer isolates the switched capacitor circuit from the analog input pin so that it reduces the kickback noise introduced by the operation of the switched capacitor circuit. It is critical to have an ADC with an integrated input buffer for a high sampling rate and input frequency.

In operation, the first switch and the second switch of the switched capacitor circuit close simultaneously, while the second switch opens right before the first switch opens to minimize signal dependent distortion that is introduced by the switching. When the first and second switches close, the input buffer drives a voltage onto the capacitor that represents the magnitude of the analog input signal on the analog input pin. The voltage on the capacitor is sampled the moment the second switch opens. The sampled voltage is then sensed and converted into a digital value.

The number of times both switches open per second is known as the sampling frequency. As the sampling frequency increases, the time period for sampling the analog input signal decreases. The input frequency of the ADC increases generally as the sampling frequency increases to capture a wider frequency range signal. Furthermore, intermediate frequency (IF) sampling simplifies the overall analog signal path system design compared to baseband sampling with a super heterodyne system.

An integrated unity-gain input buffer should have higher bandwidth and drive capability as the input frequency increases. In high-speed applications, an integrated high-speed unity-gain input buffer must drive a sampling capacitor switched at a high sampling rate as well as operated at a high input frequency. In addition, an integrated high-speed unity-gain input buffer should possess high linearity, high stability, wide bandwidth, and low noise with a low supply voltage.

SUMMARY OF THE INVENTION

The present invention provides a high-speed unity-gain input buffer that has high linearity, high stability, wide bandwidth, and low noise with a low supply voltage. The input buffer of the present invention includes a first transistor that is connected to an input node and an output node, and a second transistor that is connected to ground. The input buffer of the present invention also includes a third transistor that is connected to the second transistor and ground, and a fourth transistor that is connected to the first transistor and the third transistor.

A better understanding of the features and advantages of the present invention will be obtained by reference to the following detailed description and accompanying drawings which set forth an illustrative embodiment in which the principals of the invention are utilized.

DETAILED DESCRIPTION OF THE INVENTION

Figure 1:
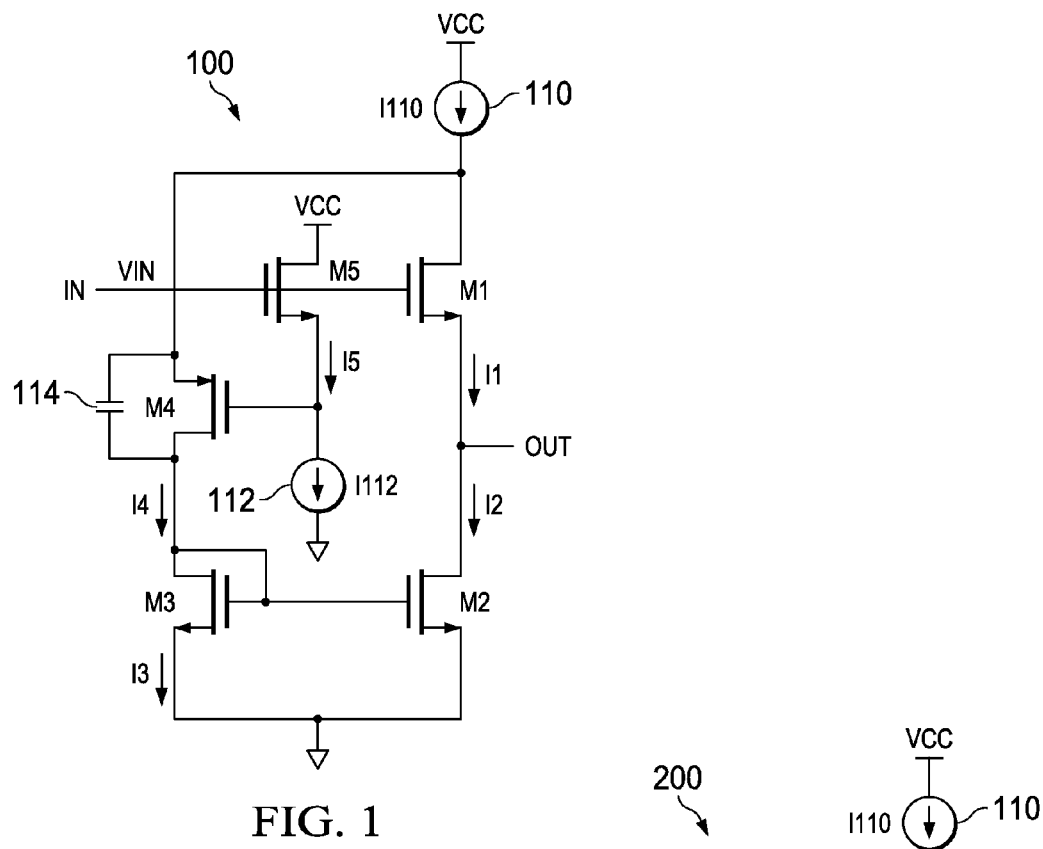
FIG. 1 is a schematic diagram illustrating an example of an input buffer 100 in accordance with the present invention.

FIG. 1 shows a schematic diagram that illustrates an example of an input buffer 100 in accordance with the present invention. As described in greater detail below, input buffer 100 steers the amount of current that flows through two currents paths in response to an analog input signal. The current in the first path flows into an output node, while the current in the second path is mirrored to form a current that flows out of the output node.

As shown in FIG. 1, input buffer 100 includes an NMOS transistor M1 that has a gate connected to an input node IN, a source connected to an output node OUT, and a drain. Input buffer 100 also includes an NMOS transistor M2 that has a gate, a source connected to ground, and a drain connected to the output node OUT.

In addition, input buffer 100 includes an NMOS transistor M3 that has a gate and a drain connected to the gate of NMOS transistor M2, and a source connected to ground. Input buffer 100 further includes a PMOS transistor M4 that has a gate, a source connected to the drain of NMOS transistor M1, and a drain connected to the gate and the drain of NMOS transistor M3.

Input buffer 100 also includes an NMOS transistor M5 that has a gate connected to the input node IN, a source connected to the gate of PMOS transistor M4, and a drain connected to a supply voltage VCC or a fixed DC voltage. Further, input buffer 100 includes a current source 110 and a current source 112. Current source 110 sources a current I110 to the drain of NMOS transistor M1 and the source of PMOS transistor M4. Current source 112 sinks a current I112 from the source of NMOS transistor M5.

Input buffer 100 additionally includes a compensation capacitor 114. Capacitor 114 has a first plate connected to the source of PMOS transistor M4 (and the drain of NMOS transistor M1), and a second plate connected to the drain of PMOS transistor M4 (and the drain of NMOS transistor M3).

The value of capacitor 114 is based on the stability requirement, sampling frequency, and input frequency range.

In operation, the input node IN of input buffer 100 is connected to an analog input signal VIN, while the output node OUT is connected to a circuit element, such as the first switch in a switched capacitor circuit of an ADC. The input common mode level at the input node IN is higher than the common mode level at the output node OUT by the gate-to-source voltage of NMOS transistor M1.

The analog input signal VIN ranges between a minimum voltage and a maximum voltage. For example, with a 0.9V common mode at the output node OUT and 0.6V of gate-to-source voltage of NMOS transistor M1, the analog input signal VIN can have a 1V swing and range between a minimum voltage of 1.0V and a maximum voltage of 2.0V.

Input buffer 100 has three basic operating conditions: an equilibrium condition, a push-up condition, and a pull-down condition. The equilibrium condition occurs when the analog input signal VIN is constant (not rising and not falling). When the analog input signal VIN is constant, NMOS transistor M1 drives a current I1 into the output node OUT, while NMOS transistor M2 sinks a current I2 from the output node OUT that is equal to the current I1.

NMOS transistor M1 sinks a portion of the current I110 that is output by current source 110, and outputs the current I1 with a magnitude that is essentially equal to the portion of the current I110 that is sunk by NMOS transistor M1. PMOS transistor M4 sinks the remaining portion of the current I110 that is output by current source 110, and outputs a current I4 that is essentially equal to the remaining portion of the current I110 that is sunk by PMOS transistor M4. Thus, the current I1, which flows down a first path, and the current I4, which flows down a second path, are summed up to be equal to the current I110.

In addition, NMOS transistor M3 sinks the current I4, and outputs a current I3 that is essentially equal to the current I4, while NMOS transistor M2 mirrors the current I3 to set the magnitude of the current I2 to be equal to the current I1. Thus, the current I1 flows down the first path, the currents I4 and I3 flow down the second path, and NMOS transistor M2 mirrors the current I3 to set the magnitude of the current I2, which flows down the first path.

As noted above, when the equilibrium condition is present, the currents I1 and I2 are equal. The currents I3 and I4, which are essentially equal, are equal to the currents I1 and I2 if the NMOS transistors M2 and M3 are identical. One-half of the current I110 output from current source 110 flows along the first path through the MOS transistors M1 and M2, and one-half of the current I110 flows along the second path through the MOS transistors M3 and M4. In this example, the currents I1, I2, I3, and I4 are each essentially equal.

Alternately, the magnitudes of the currents I3 and I4 can be less than the magnitudes of the currents I1 and I2. For example, NMOS transistor M2 can be sized to be 2.5× bigger than NMOS transistor M3 so that 2.5× as much of the current flows through the MOS transistors M1 and M2 as does the MOS transistors M3 and M4. The size ratio between the NMOS transistors M2 and M3 determines the current efficiency of input buffer 100, and affects the output impedance seen at the output node OUT, and the stability of input buffer 100.

The push-up condition occurs when the analog input signal VIN increases. When the analog input signal VIN increases, NMOS transistor M1 drives more current into the output node OUT, while NMOS transistor M2 sinks less current from the output node OUT. As a result, the voltage on the output node OUT increases and follows the increasing voltage of the analog input signal VIN.

When the magnitude of the analog voltage signal VIN increases, the gate-to-source voltage of transistor M1 increases, which causes the magnitude of the current I1 to increase. Since current source I110 is a constant current source, an increase in the magnitude of the current I1 results in a decrease in the magnitude of the current I4.

The decreased magnitude of the current I4 output by PMOS transistor M4 is then sunk by NMOS transistor M3 and mirrored by NMOS transistor M2, thereby decreasing the magnitude of the current I2. Thus, when the push-up condition is present, the current I1 is greater than the current I2.

The pull-down condition occurs when the analog input signal VIN decreases. When the analog input signal VIN decreases, NMOS transistor M1 drives less current into the output node OUT, while NMOS transistor M2 sinks more current from the output node OUT. As a result, the voltage on the output node OUT decreases and follows the decreasing voltage of the analog input signal VIN.

When the magnitude of the analog input signal VIN decreases, the gate-to-source voltage of transistor M1 decreases, which causes the magnitude of the current I1 to decrease. Since current source I110 is a constant current source, a decrease in the magnitude of the current I1 results in an increase in the magnitude of the current I4.

The increased magnitude of the current I4 output by PMOS transistor M4 is then sunk by NMOS transistor M3 and mirrored by NMOS transistor M2, thereby increasing the magnitude of the current I2. Thus, when the pull-down condition is present, the current I2 is greater than the current I1.

As a result, input buffer 100 provides push-pull action (sourcing more current than is sunk to push up the output voltage, and sinking more current than is sourced to pull down the output voltage) without using a PMOS and NMOS transistor pair as is used in conventional class-AB push-pull amplifiers.

A push-pull output stage is more power efficient by alternately sourcing current to or sinking current from the output node as compared to a power inefficient class-A type output stage that has a constant current flowing from the supply to ground. However, input buffer 100 also provides follower action like a conventional class-A source/emitter-follower amplifier in that the source/emitter voltages of transistors M1 and M5 follow the gate/base voltages of transistors M1 and M5. Thus, the present invention provides the advantages of both class-A source/emitter-follower amplifiers and class-AB push-pull amplifiers.

Another advantage of the present invention is that input buffer 100 is highly linear. The linearity of input buffer 100 is a function of the drain-to-source voltage change of NMOS transistor M1 across the analog input signal VIN range. For example, as the analog input signal VIN moves, a voltage buffer that has a substantially constant drain-to-source voltage also has a substantially constant output impedance.

The gate node of PMOS transistor M4, which sets the voltage on the drain of NMOS transistor M1, is not directly connected to the main signal path. Instead, NMOS transistor M5 isolates PMOS transistor M4 from the main signal path. This substantially reduces the introduction of kickback noise into the signal path that includes the MOS transistors M2, M3, and M4.

Another advantage of the present invention is that the compensation capacitor 114 of input buffer 100 can be added to improve loop stability. Input buffer 100 has an inherent right-half plane zero at $gm1*gm4/(Cp*gm4)$ which deteriorates loop stability. Gm1 is the transconductance of NMOS transistor M1, gm4 is the transconductance of PMOS transistor M4, and Cp is the total parasitic capacitance at the drain node of NMOS transistor M1. The added capacitance Cc provided by compensation capacitor 114 moves the location of the zero from the right-half plane to the left-half plane by making Cc*gm1 greater than Cp*gm4, thereby improving loop stability. The new location of the zero is now gm1*gm4/[(Cp*gm4)−(Cc*gm1)]. Furthermore, the value of compensation capacitor 114 can also be selected so that the zero can be used to cancel out a second pole.

A further advantage of the present example of input buffer 100 is that the present example has a high slew rate because of the push-pull action. As the analog input signal VIN increases, the push-up condition is present. The current I1 is larger than the current I2, which allows the voltage on the output node OUT to be pushed up quicker when the voltage on the input node IN increases. As the analog input signal VIN decreases, the push-down condition is present. The current I1 is smaller than the current I2, which allows the voltage on the output node OUT to be pulled down quicker when the voltage on the input node IN decreases.

Another advantage of the present invention is a higher input transconductance which increases bandwidth. The transconductance of input buffer 100 is the transconductance of NMOS transistor M2 times the size ratio of NMOS transistors M2 and M3 plus the transconductance of NMOS transistor M1, that is gm1+gm2*(M2/M3).

A further advantage of the present invention is that input buffer 100 requires a lower supply voltage compared to other input buffers. For example, the maximum voltage on the drain of NMOS transistor M1 is designed to be equal to or less than the maximum voltage of the analog input signal VIN. The maximum voltage on the drain of NMOS transistor M1, in combination with the voltage drop required by current source 110, defines the minimum supply voltage VCC.

By contrast, if the gate of PMOS transistor M4 is connected to the analog input signal VIN, then the maximum voltage on the drain of NMOS transistor M1 would be equal to the maximum voltage of the analog input signal VIN plus the gate-to-source voltage of PMOS transistor M4. As a result, the minimum supply voltage VCC is higher by the gate-to-source voltage of PMOS transistor M4.

The minimum supply voltage VCC can be further reduced by lowering the voltage on the drain node of NMOS transistor M1 by increasing the current density of NMOS transistor M5 and/or reducing the current density of PMOS transistor M4. Alternately, the voltage on the gate of PMOS transistor M4 can be reduced by adding a serial resistor at the source of NMOS transistor M5.

Figure 2:
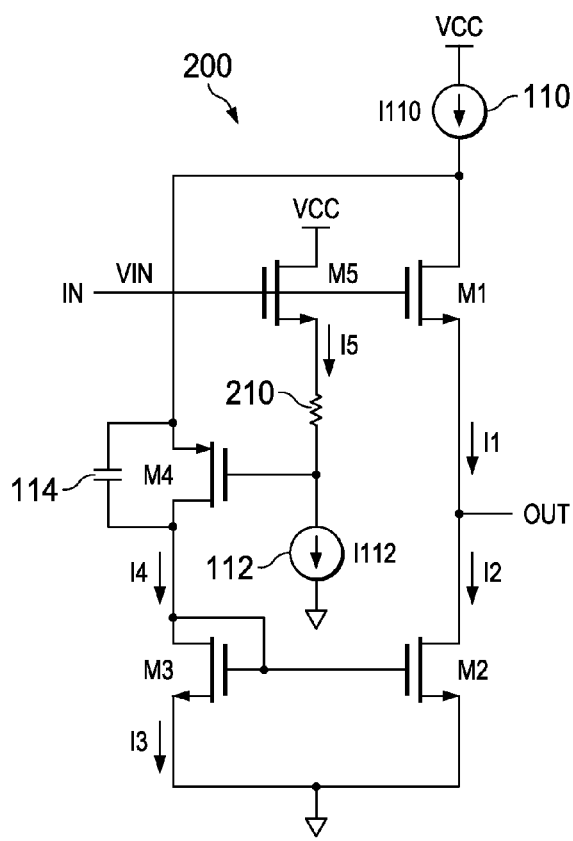
FIG. 2 is a schematic diagram illustrating an example of an input buffer 200 in accordance with an alternate embodiment of the present invention.

FIG. 2 shows a schematic diagram that illustrates an example of an input buffer 200 in accordance with an alternate embodiment of the present invention. Input buffer 200 is similar to input buffer 100 and, as a result, utilizes the same reference numerals to designate the structures that are common to both input buffers.

As shown in FIG. 2, input buffer 200 is the same as input buffer 100 except that input buffer 200 further includes a resistor 210 that has a first end connected to the source of NMOS transistor M5 and a second end connected to the gate of PMOS transistor M4 and current source 112. In operation, resistor 210 lowers the voltage on the gate of PMOS transistor M4 which, in turn, lowers the voltage on the source node of PMOS transistor M4 and the drain of NMOS transistor M1.

Thus, unlike input buffer 100 where the voltage at the drain node of NMOS transistor M1 and the source node of PMOS transistor M4 is equal to the voltage on the input node IN, the voltage at the drain node of NMOS transistor M1 and the source node of PMOS transistor M4 of input buffer 200 is less than the voltage on the input node IN. Input buffer 200 operates the same as input buffer 100, except that the voltage on the drain of NMOS transistor M1 in input buffer 200 is lower than in input buffer 100.

Figure 3:
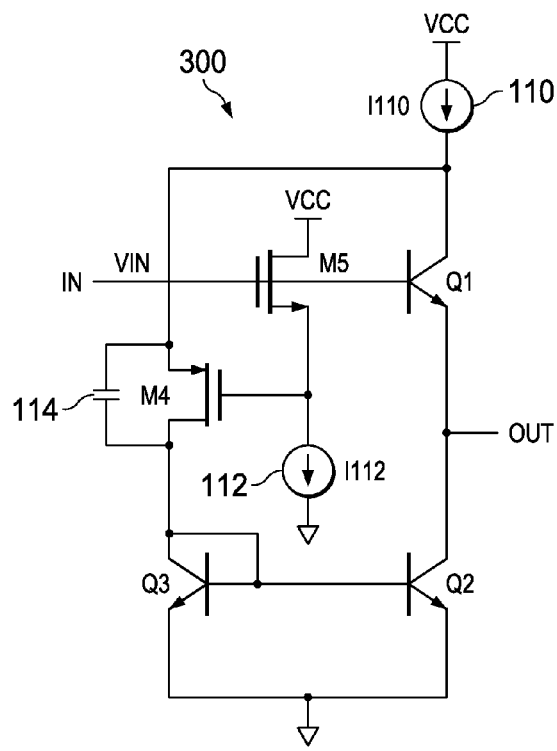
FIG. 3 is a schematic diagram illustrating an example of an input buffer 300 in accordance with an alternate embodiment of the present invention.

FIG. 3 shows a schematic diagram that illustrates an example of an input buffer 300 in accordance with an alternate embodiment of the present invention. Input buffer 300 is similar to input buffer 100 and, as a result, utilizes the same reference numerals to designate the structures that are common to both input buffers.

As shown in FIG. 3, input buffer 300 is the same as input buffer 100 except that input buffer 300 utilizes an NPN bipolar transistor Q1 in lieu of NMOS transistor M1, an NPN bipolar transistor Q2 in lieu of NMOS transistor M2, and an NPN transistor Q3 in lieu of NMOS transistor M3.

NPN bipolar transistor Q1 has a base connected to the input node IN, a collector connected to the source of PMOS transistor M4, and an emitter connected to the output node OUT. NPN bipolar transistor Q2 has a base, a collector connected to the output node OUT, and an emitter connected to ground.

NPN bipolar transistor Q3 has a base and a collector connected to the base of transistor Q2 and the drain of PMOS transistor M4, and an emitter connected to ground. NMOS transistor M5 is used instead of an NPN bipolar transistor to lower the voltage on the drain of NPN bipolar transistor Q1. In the present example, the NPN bipolar transistors Q1, Q2, and Q3 are implemented with a high-speed Silicon Germanium process to provide better linearity and wider bandwidth. Input buffer 300 operates the same as input buffer 100.

Figure 4:
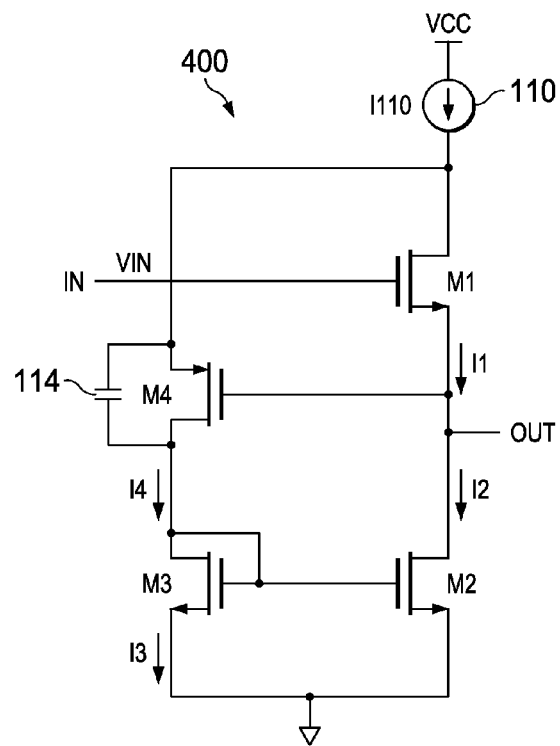
FIG. 4 is a schematic diagram illustrating an example of an input buffer 400 in accordance with an alternate embodiment of the present invention.

FIG. 4 shows a schematic diagram that illustrates an example of an input buffer 400 in accordance with an alternate embodiment of the present invention. Input buffer 400 is similar to input buffer 100 and, as a result, utilizes the same reference numerals to designate the structures that are common to both input buffers.

As shown in FIG. 4, input buffer 400 is the same as input buffer 100 except that input buffer 400 eliminates NMOS transistor M5 and current source 112. Input buffer 400 further differs from input buffer 100 in that the gate of PMOS transistor M4 is connected to the output node OUT. Input buffer 400 operates the same as input buffer 100 except that the voltage on the output node OUT sets the voltage on the gate of PMOS transistor M4. Input buffer 400 has substantially less isolation than input buffer 100, but otherwise shares the advantages of input buffer 100.

Figure 5:
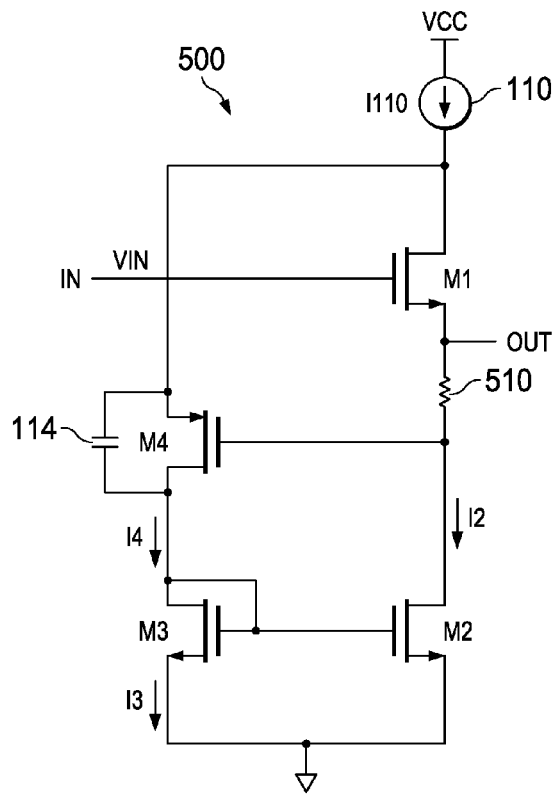
FIG. 5 is a schematic diagram illustrating an example of an input buffer 500 in accordance with an alternate embodiment of the present invention.

FIG. 5 shows a schematic diagram that illustrates an example of an input buffer 500 in accordance with an alternate embodiment of the present invention. Input buffer 500 is similar to input buffer 400 and, as a result, utilizes the same reference numerals to designate the structures that are common to both input buffers.

As shown in FIG. 5, input buffer 500 is the same as input buffer 400 except that input buffer 500 further includes a resistor 510 that has a first end connected to the source of NMOS transistor M1 and a second end connected to the output node OUT. In operation, resistor 510 lowers the voltage on the gate of PMOS transistor M4 which, in turn, lowers the voltage on the source of PMOS transistor M4 and the drain of NMOS transistor M1.

Figure 6:
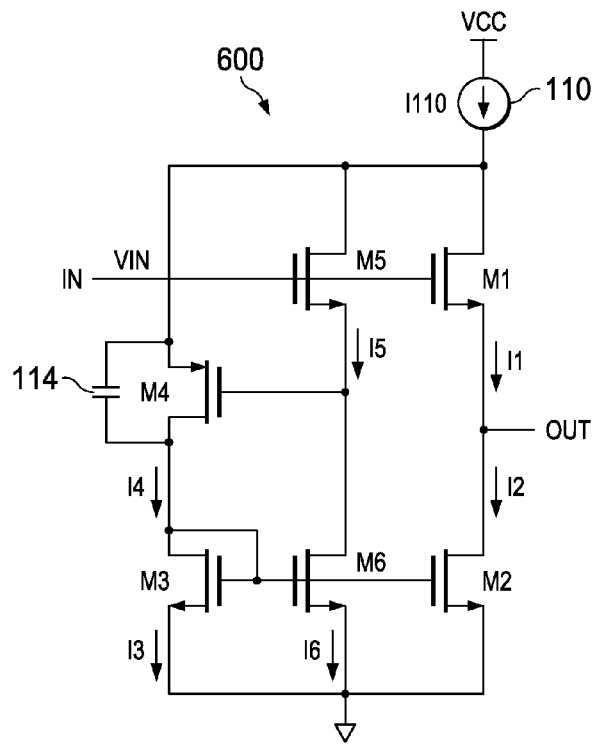
FIG. 6 is a schematic diagram illustrating an example of an input buffer 600 in accordance with an alternate embodiment of the present invention.

FIG. 6 shows a schematic diagram that illustrates an example of an input buffer 600 in accordance with an alternate embodiment of the present invention. Input buffer 600 is similar to input buffer 100 and, as a result, utilizes the same reference numerals to designate the structures that are common to both input buffers.

As shown in FIG. 6, input buffer 600 is the same as input buffer 100 except that input buffer 600 utilizes an NMOS transistor M6 in lieu of current source 112. NMOS transistor M6 has a gate connected to the gates of NMOS transistors M2 and M3, a source connected to ground, and a drain connected to the gate of PMOS transistor M4 and the source of NMOS transistor M5. In addition, input buffer 600 also differs from input buffer 100 in that the drain of NMOS transistor M5 is connected to current source 110 rather than the supply voltage VCC.

Input buffer 600 operates the same as input buffer 100 except that NMOS transistor M6 of input buffer 600 outputs a current I6 that is equal to the current I5 output by NMOS transistor M5 when the equilibrium condition is present. In addition, the current I6, which mirrors the current I3, is less than the current I5 when the push-up condition is present, and greater than the current I5 when the pull-down condition is present. Further, the NMOS transistors M5 and M6, which isolate switching noise, form a current path that is a scaled replica of the current path through the NMOS transistors M1 and M2.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. An input buffer comprising:
    a first transistor connected to an input node and an output node;
    a second transistor connected to ground;
    a third transistor connected to the second transistor and ground; and
    a fourth transistor connected to the first transistor and the third transistor,
    a fifth transistor connected to the input node and the fourth transistor,
    a first current source connected to the first transistor and the fourth transistor; and
    a second current source connected to the fourth transistor, the fifth transistor, and ground.

2. The input buffer of claim 1 and further comprising a resistive structure connected to the first transistor, the second transistor, and the output node.

3. The input buffer of claim 1 wherein the first transistor and the fourth transistor are connected to the output node.

4. The input buffer of claim 1 wherein the fourth transistor is unconnected to the input node, and the second transistor is bigger than the third transistor.

5. The input buffer of claim 1 further comprising a capacitor connected to the first transistor and the third transistor.

6. The input buffer of claim 1 wherein:
    the first transistor has a gate connected to the input node, a source connected to the output node, and a drain connected to the fourth transistor;
    the second transistor has a gate connected to the third transistor, a source connected to ground, and a drain connected to the output node; and
    the third transistor has a gate and a drain connected to the fourth transistor and the gate of the second transistor, and a source connected to ground.

7. The input buffer of claim 1 wherein:
    the first transistor has a base connected to the input node, an emitter connected to the output node, and a collector connected to the fourth transistor;
    the second transistor has a base connected to the third transistor, an emitter connected to ground, and a collector connected to the output node; and
    the third transistor has a base and a collector connected to the fourth transistor and the base of the second transistor, and an emitter connected to ground,
    wherein a voltage shared by the first transistor and the fourth transistor is equal to or less than a voltage on the input nod, and
    a resistive structure connected to the second transistor and the output node.

8. The input buffer of claim 7 and further comprising:
    a fifth transistor connected to the input node; and
    a resistive structure connected to the fifth transistor and the fourth transistor.

9. The input buffer of claim 7 wherein the first transistor and the fourth transistor are connected to the second transistor.

10. The input buffer of claim 7 and further comprising a fifth transistor connected to the input node and the fourth transistor.

11. The input buffer of claim 10 and further comprising:
    a current source connected to the first transistor and the fourth transistor; and
    a sixth transistor connected to the second transistor, the third transistor, the fourth transistor, the fifth transistor, and ground.

12. The input buffer of claim 11 wherein the fourth transistor is unconnected to the input node, and the second transistor is bigger than the third transistor.

13. The input buffer of claim 11 and further comprising a capacitor connected to the first transistor and the third transistor.

14. The input buffer of claim 11 wherein:
    the first transistor has a gate connected to the input node, a source connected to the output node, and a drain connected to the fourth transistor;
    the second transistor has a gate connected to the third transistor, a source connected to ground, and a drain connected to the output node; and
    the third transistor has a gate and a drain connected to the fourth transistor and the gate of the second transistor, and a source connected to ground.

15. The input buffer of claim 11 wherein:
    the first transistor has a base connected to the input node, an emitter connected to the output node, and a collector connected to the fourth transistor;
    the second transistor has a base connected to the third transistor, an emitter connected to ground, and a collector connected to the output node; and
    the third transistor has a base and a collector connected to the fourth transistor and the base of the second transistor, and an emitter connected to ground.

16. The input buffer of claim 11 and further comprising:
    a fifth transistor connected to the input node; and
    a resistive structure connected to the fifth transistor and the fourth transistor.

* * * * *